US00RE45739E

(19) United States
(12) Reissued Patent
Bergesch

(10) Patent Number: US RE45,739 E
(45) Date of Reissued Patent: *Oct. 6, 2015

(54) TOOL-LESS INSTALLATION SYSTEM AND METHOD OF U-MOUNTED DEVICES

(71) Applicant: SCHNEIDER ELECTRIC IT CORPORATION, West Kingston, RI (US)

(72) Inventor: Joseph H. Bergesch, Chesterfield, MO (US)

(73) Assignee: SCHNEIDER ELECTRIC IT CORPORATION, West Kingston, RI (US)

( * ) Notice: This patent is subject to a terminal disclaimer.

(21) Appl. No.: 14/024,236

(22) Filed: Sep. 11, 2013

Related U.S. Patent Documents

Reissue of:
(64) Patent No.: 8,262,041
Issued: Sep. 11, 2012
Appl. No.: 12/569,302
Filed: Sep. 29, 2009

(51) Int. Cl.
*A47B 96/06* (2006.01)
*H05K 7/18* (2006.01)

(52) U.S. Cl.
CPC ..... *H05K 7/183* (2013.01)

(58) Field of Classification Search
CPC ..... H05K 7/183; H05K 7/18; H05K 7/186; H05K 7/14; H05K 7/1488; H05K 7/1489
USPC ..... 248/220.31, 220.41, 220.43, 222.11; 211/191, 183, 192, 103; 312/265.6, 312/334.4
See application file for complete search history.

(56) References Cited

U.S. PATENT DOCUMENTS

| | | | | |
|---|---|---|---|---|
| 4,536,904 | A * | 8/1985 | Whitehead | 5/201 |
| 6,070,957 | A * | 6/2000 | Zachrai | 312/334.4 |
| 6,431,668 | B1 * | 8/2002 | Reddicliffe | 312/334.5 |
| 6,622,873 | B2 * | 9/2003 | Hegrenes et al. | 211/26 |
| 6,840,388 | B2 | 1/2005 | Mayer | |
| 6,866,154 | B2 | 3/2005 | Hartman et al. | |

(Continued)

FOREIGN PATENT DOCUMENTS

| | | | |
|---|---|---|---|
| DE | 202007018054 | U1 | 3/2008 |
| DE | 202009007522 | U1 | 8/2009 |

OTHER PUBLICATIONS

International Search Report for PCT/US2010/050404 mailed Dec. 12, 2010.

*Primary Examiner* — Patricia Engle
(74) *Attorney, Agent, or Firm* — Lando & Anatasi LLP

(57) ABSTRACT

A device is configured to be secured within an equipment rack of the type having two spaced-apart mounting flanges, with each flange having a plurality of openings formed therein spaced-apart from one another a predetermined distance. The device includes an elongated body having two, opposite ends and two attachment configurations, one for each end of the elongated body. Each attachment configuration has at least one retention element to be inserted within the openings of the mounting flanges. At least one attachment configuration has a plunger pin configured to retain the device to the mounting rails. The attachment configuration is constructed and arranged to facilitate tool-less installation and removal of the device with the mounting rails. Other embodiments of the device and a method of securing the device to an equipment rack are further disclosed.

12 Claims, 14 Drawing Sheets

(56) References Cited

U.S. PATENT DOCUMENTS

| | | | | |
|---|---|---|---|---|
| 7,293,666 | B2 | 11/2007 | Mattlin et al. | |
| 7,472,970 | B2 | 1/2009 | Bergesch et al. | |
| 7,488,202 | B2 | 2/2009 | Spitaels et al. | |
| 7,506,768 | B2 | 3/2009 | Rassmussen et al. | |
| 7,682,187 | B2 | 3/2010 | Spitaels et al. | |
| 8,262,041 | B2 | 9/2012 | Bergesch | |
| 2001/0040203 | A1* | 11/2001 | Brock et al. | 248/222.11 |
| 2004/0159618 | A1 | 8/2004 | Nguyen et al. | |
| 2004/0189162 | A1* | 9/2004 | Davis et al. | 312/265.3 |
| 2004/0217073 | A1 | 11/2004 | Dobler et al. | |
| 2006/0284038 | A1 | 12/2006 | Hartman et al. | |
| 2009/0167127 | A1* | 7/2009 | Chen et al. | 312/334.1 |
| 2009/0294393 | A1 | 12/2009 | Chen et al. | |
| 2010/0200523 | A1* | 8/2010 | Henderson | 211/26 |
| 2010/0221941 | A1 | 9/2010 | Andersen et al. | |
| 2012/0091090 | A1* | 4/2012 | Larsen et al. | 211/184 |
| 2015/0122751 | A1* | 5/2015 | Vasilevsky | H05K 7/14 |

* cited by examiner

TOOL-LESS INSTALLATION SYSTEM AND METHOD OF U-MOUNTED DEVICES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND OF THE INVENTION

1. Field of the Invention

The present invention relates to racks and enclosures, and more particularly to racks and enclosures used to house data processing, networking and telecommunications equipment.

2. Discussion of Related Art

Equipment enclosures for electronic equipment, such as data processing, networking and telecommunications equipment have been in use for years. Over the years, a number of different standards have been developed to enable equipment manufacturers to design rack mountable equipment that can be mounted in standard equipment racks manufactured by different manufacturers. One such standard is the Electronic Industries Association's EIA-310-D standard which defines parameters for what has become an industry standard nineteen inch equipment rack.

Nineteen inch equipment racks are used extensively in data centers and other facilities. With the proliferation of the Internet, it is not uncommon for a data center to contain hundreds of these equipment racks. Further, with the ever decreasing size of computer equipment, and in particular, computer servers, the number of electrical connectors mounted in each equipment rack has been increasing, raising additional power distribution, cooling and cable distribution concerns at the rack level. With these increasing concerns, there is a need for equipment racks that are flexible enough to satisfy a variety of different requirements, capable of meeting industry standards, and sufficiently simple in design to be cost effective, given the quantities of these equipment racks that may be used in a facility.

SUMMARY OF THE INVENTION

One aspect of the disclosure is directed to a device configured to be secured within an equipment rack of the type having two spaced-apart mounting flanges. Each flange has a plurality of openings formed therein spaced-apart from one another a predetermined distance. In one embodiment, the device comprises an elongated body having two, opposite ends and two attachment configurations, one for each end of the elongated body. Each attachment configuration includes at least one retention element to be inserted within the openings of the mounting flanges. At least one attachment configuration includes a plunger pin configured to retain the device to the mounting rails. The attachment configuration is constructed and arranged to facilitate tool-less installation and removal of the device with the mounting rails.

Embodiments of the device may include providing each end of the elongated body of the device with a flange portion. The plunger pin may include a head portion extending from an outer surface of the flange portion and a pin portion extending from an inner surface of the flange portion. The retention element may include a hook defined along an inner surface of the flange portion. The hook may be configured so that it slopes away from the inner surface and is bent so that it extends horizontally with respect to the flange portion. The hook may be one of several hooks configured to extend in the same direction so as to enable the insertion of the hooks within corresponding openings provided in two mounting flanges. The hooks may be secured in place by moving the body of the device laterally. In a certain embodiment, the device is a power distribution unit. In other embodiments, the device is one of a rail and a panel.

Another aspect of the disclosure is directed to a device configured to be secured within an equipment rack of the type having two spaced-apart mounting flanges. Each flange has a plurality of openings formed therein spaced-apart from one another a predetermined distance. In one embodiment, the device comprises an elongated body having two, opposite ends and two attachment configurations, one for each end of the elongated body. Each attachment configuration includes at least one retention element to be inserted within the openings of the mounting flanges. At least one attachment configuration includes means for releasably securing the device to the mounting rails. The attachment configuration is constructed and arranged to facilitate tool-less installation and removal of the device with the mounting rails.

Embodiments of the device may include providing a flange portion at each end of the elongated body of the device. The means for releasably securing the device to the mounting rails may comprise a plunger pin including a head portion extending from an outer surface of the flange portion and a pin portion extending from an inner surface of the flange portion. The retention element may include a hook defined along an inner surface of the flange portion. The hook may be configured so that it slopes away from the inner surface and is bent so that it extends horizontally with respect to the flange portion. The hook may be one of several hooks configured to extend in the same direction so as to enable the insertion of the hooks within corresponding openings provided in two mounting flanges. The hooks may be secured in place by moving the body of the device laterally. In one embodiment, the device is a power distribution unit. In other embodiments, the device is one of a rail and a panel.

Yet another aspect of the disclosure is directed to a method of installing a device on an equipment rack of the type having two spaced-apart mounting flanges. Each flange has a plurality of openings formed therein spaced-apart from one another a predetermined distance. In one embodiment, the method comprises: inserting the retention elements of the device into the respective openings of the mounting flanges; moving the device in a lateral direction suitable for engaging the retention elements of the device with the mounting flanges; and inserting a plunger pin into an opening of the mounting flange to secure the device in place.

In a certain embodiment, the method may further comprise, prior to inserting the retention elements of the device into the respective openings, aligning retention elements of the device with respective openings of the mounting flanges.

The present invention will be more fully understood after a review of the following figures, detailed description and claims.

BRIEF DESCRIPTION OF THE DRAWINGS

For a better understanding of the present invention, reference is made to the figures which are incorporated herein by reference and in which.

DETAILED DESCRIPTION OF THE PREFERRED EMBODIMENTS

Figure 1:
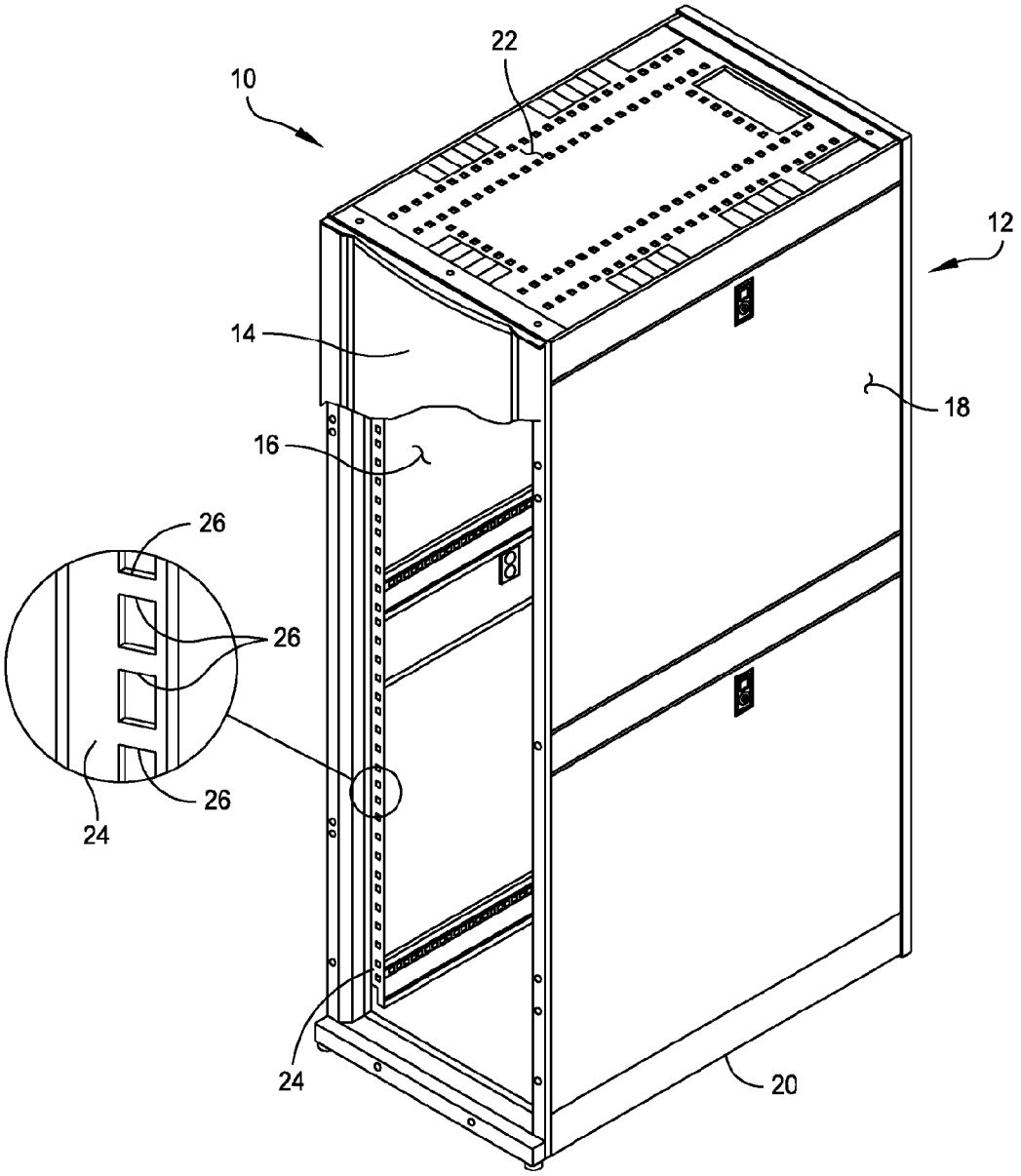
FIG. 1 is a perspective view of an exemplary equipment rack.

For the purposes of illustration only, and not to limit the generality, the present invention will now be described in detail with reference to the accompanying figures. This invention is not limited in its application to the details of construction and the arrangement of components set forth in the following description or illustrated in the drawings. The invention is capable of other embodiments and of being practiced or being carried out in various ways. Also the phraseology and terminology used herein is for the purpose of description and should not be regarded as limiting. The use of "including," "comprising," "having," "containing" "involving," and variations thereof herein, is meant to encompass the items listed thereafter and equivalents thereof as well as additional items.

A typical data center may be designed to house a number of enclosures or equipment racks. In one embodiment, each equipment rack may be constructed in accordance with the teachings disclosed in U.S. Pat. No. 7,293,666, entitled EQUIPMENT ENCLOSURE KIT AND ASSEMBLY METHOD, which is owned by the assignee of the present disclosure and is incorporated herein by reference.

Referring to the drawings, and more particularly to FIG. 1, there is generally indicated at 10 an enclosure or equipment rack in accordance with at least one embodiment of the present disclosure to house electronic equipment, such as data processing and networking equipment (e.g., servers, server blades, associated power distribution equipment, etc.) and telecommunication equipment. In one embodiment, the equipment rack 10 is a rectangular, box-like structure that is configured such that it can be assembled with or connected to other, similarly-shaped structures. The equipment rack 10 has a frame generally indicated at 12 configured with a front door 14, a rear door (not shown), a pair of sides 16, 18, a bottom 20 and a top or "roof" 22. As will be disclosed in greater detail below, in one embodiment, the equipment rack 10 is adjustably configurable to accommodate equipment having a variety of shapes and sizes. In addition, the equipment rack 10 can be conveniently broken down and disassembled for transport or storage. In at least one embodiment, the equipment rack 10 may accommodate standard twenty-three-inch and/or nineteen-inch rack mountable equipment.

Embodiments of the disclosure provide tool-less installation systems and methods of devices, such as power distribution units, or other types of enclosure structures, such as rails, patch panels, blanking panels, brush strip panels, fan panels, sensor panels, and the like, that are configured for attachment to vertical mounting flanges or rails of the equipment rack used to contain equipment including servers, networking equipment, information technology equipment, communications equipment and other electronic components. With reference to FIG. 1, a vertical mounting flange 24 is formed to include a series of openings, each indicated at 26, formed in the mounting flange along a length of the mounting flange. In one embodiment, these openings 26 are spaced apart a predetermined distance known in the art as a 1-U distance.

In one embodiment, the systems and methods disclose structures having an attachment configuration that is constructed and arranged to facilitate tool-less installation and removal of the device to a pair of adjacent mounting flanges of an equipment rack. Each attachment configuration may include one or more retention hook, or one or more similar configuration, and any combination of such hooks and configurations. The attachment configuration may further include one or more plunger elements configured to lock the retention hooks in place on the mounting flange. The retention hooks and the plunger elements are constructed and arranged to facilitate tool-less installation and removal of the device, and to help to releasably secure the device to a pair of mounting flanges. The systems and methods disclosed herein are suitable for releasably mounting other structures, such as rails, patch panels, blanking panels brush strip panels, fan panels, sensor panels, and the like, to the mounting flanges of the equipment rack.

The retention hooks are disposed along the device and are further configured such that the device can be mounted to and removed from an equipment rack without requiring vertical movement of the device, or without requiring the device to be gripped or otherwise manipulated from above or below the device, or from inside an equipment rack. The attachment configurations thereby permit the device to be added to or removed from an equipment rack without disturbing or removing equipment or devices previously installed within the equipment rack.

In a certain embodiment, the device may be configured to define any U height, e.g., 1-U, 2-U, 3-U, etc., or fractional U height, and preferably defines a 1-U height. A 1-U height device helps provide convenience and flexibility with respect to installation and removal of devices during configuration or rearrangement of an equipment rack. One or more devices having a 1-U height are readily and easily installed into or removed from an equipment rack to help to configure or rearrange the equipment rack without the addition or removal of any more devices than necessary. Other embodiments are within the scope of the disclosure.

Figure 2:
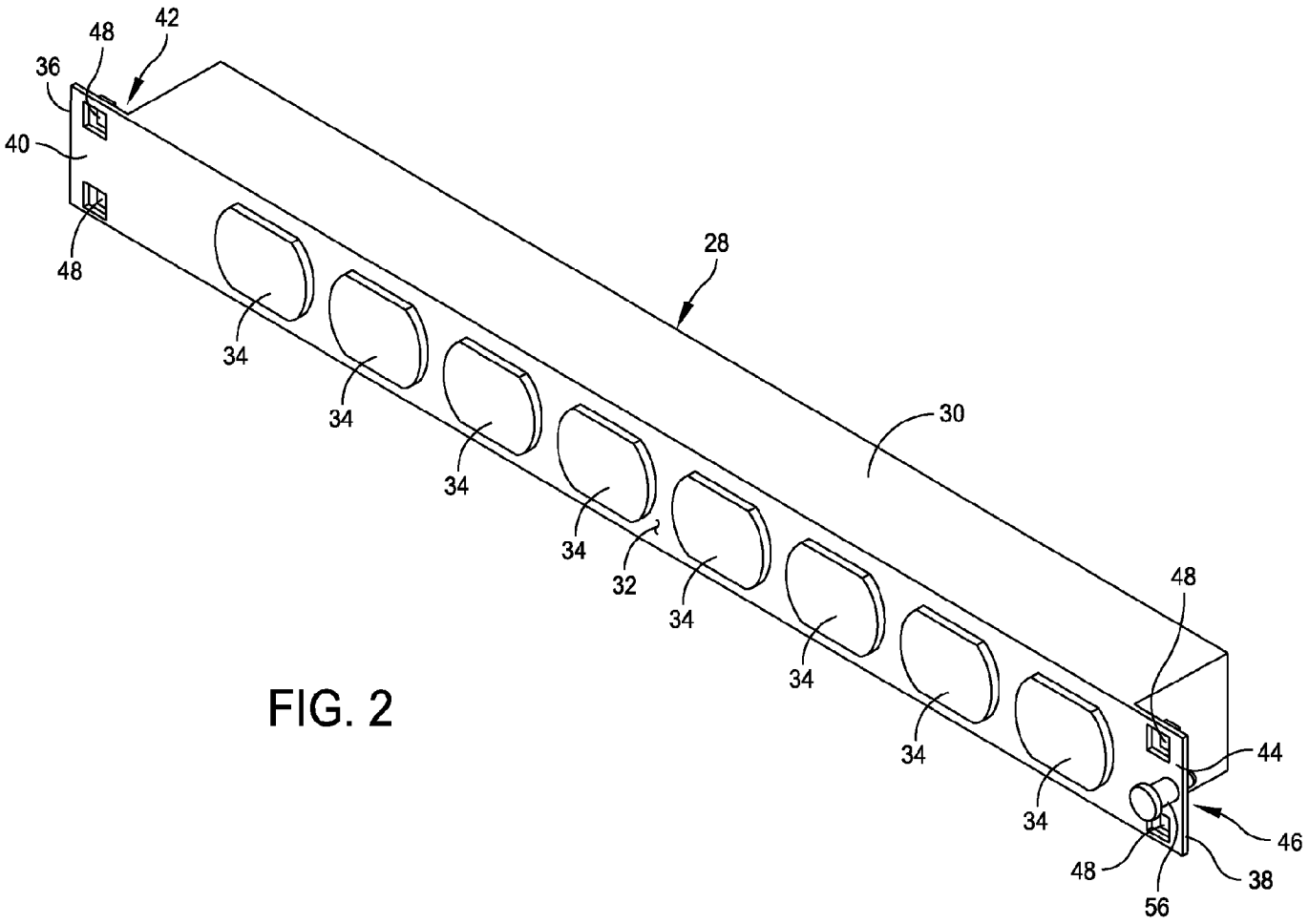
FIG. 2 is a perspective view of a device, such as a power distribution unit, configured with a tool-less mounting feature of an embodiment of the disclosure.

Referring to FIG. 2, a device, generally indicated at 28, such as a power distribution unit, includes an elongated body 30 having a front surface 32 and a plurality of outlets, each indicated at 34, formed along the front surface of the body. In one embodiment, the device 28 is configured to be mounted on a front or a back of the equipment rack 10 in which openings 26 of mounting flanges 24 of the equipment rack are facing the person installing the device. The device 28 shown in FIG. 2 has a 1-U height, but may be configured to achieve other desired heights.

The body 30 of the device 28 has two, opposite ends 36, 38. End 36 includes an extended flange portion 40 having an attachment configuration generally indicated at 42. Similarly, end 38 includes an extended flange portion 44 having an attachment configuration generally indicated at 46. The attachment configurations 42, 44 are constructed and arranged to attach or mount the device between a pair of adjacent mounting flanges of an equipment rack, such as equipment rack 10. The body 30 of the device 28 has a length sufficient to span a distance between the pair of mounting flanges 24 such that the device is mounted horizontally between the flanges. The length of the body 30 can include any length that is sufficient to horizontally mount the device 28 between a pair of flanges of any equipment rack size or design. In particular, the body 30 can define a length sufficient to mount the device 28 between pairs of flanges of a 19-inch or a 23-inch equipment rack. In other embodiments, the device 28 including attachment configurations may be employed in a situation in which the device connects and spans between horizontally orientated mounting flanges or rails.

Figure 3:
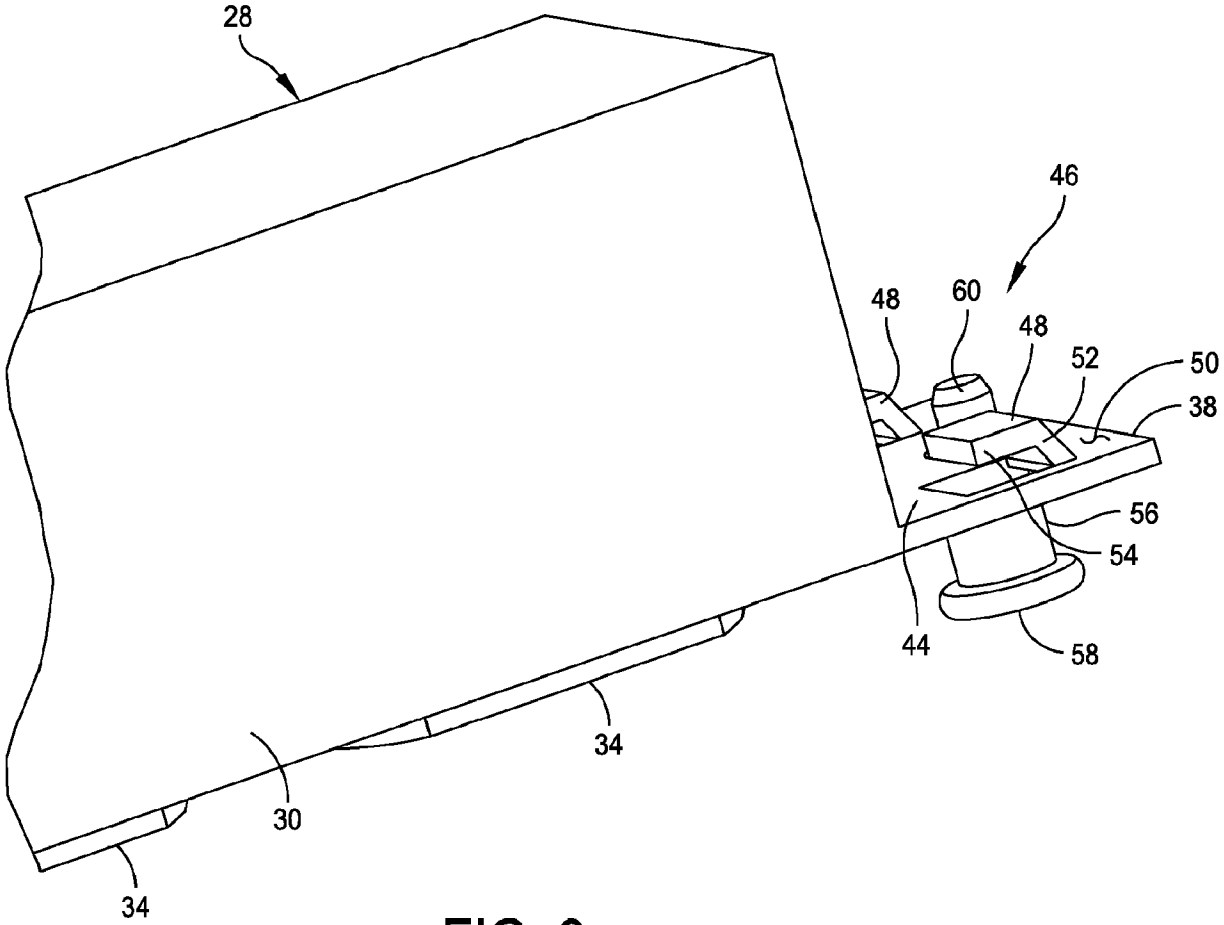
FIG. 3 is a perspective view of a tool-less mounting feature of an embodiment of the disclosure.
Figure 4A:
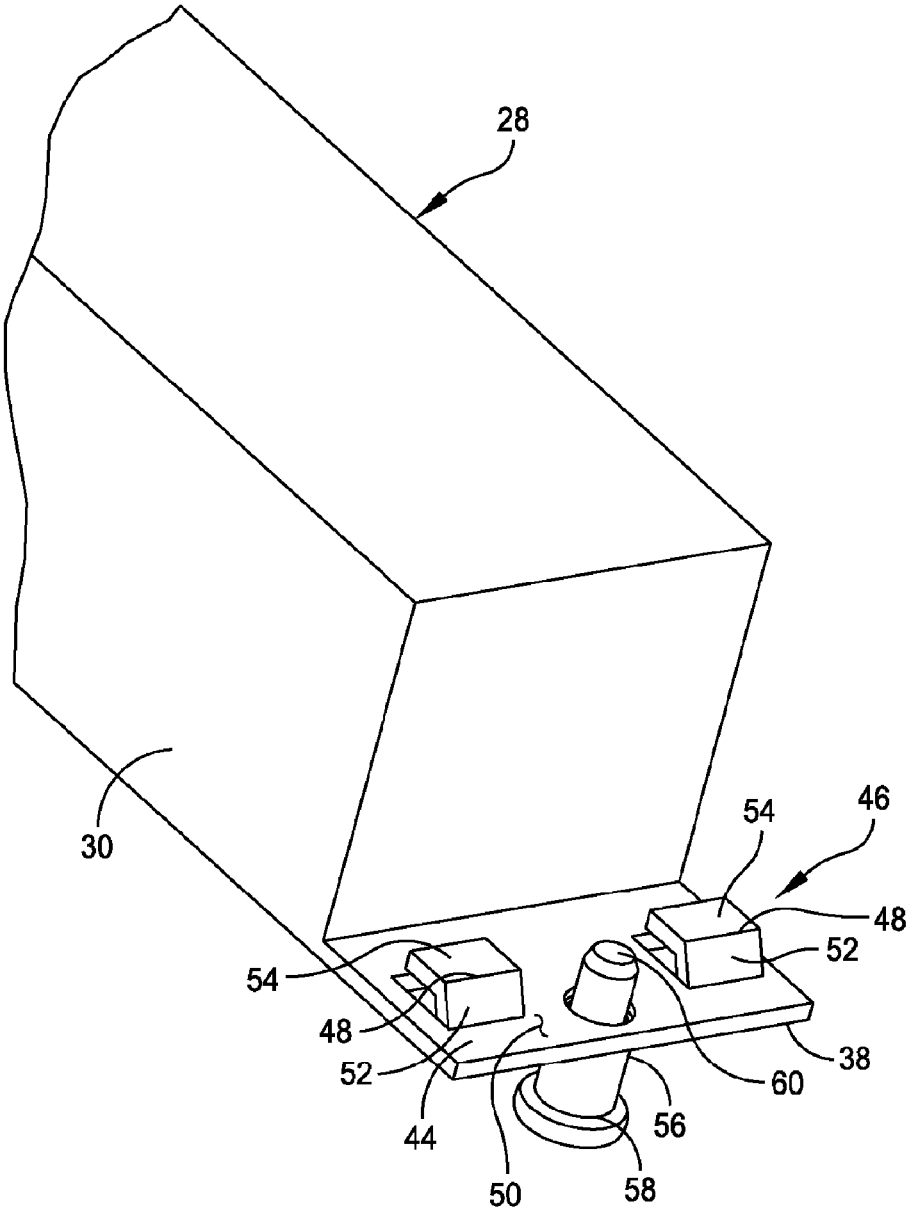
FIG. 4A is a reverse perspective view of the tool-less mounting feature shown in FIG. 3 showing a pin portion of a plunger pin assembly in an extended position.
Figure 4B:
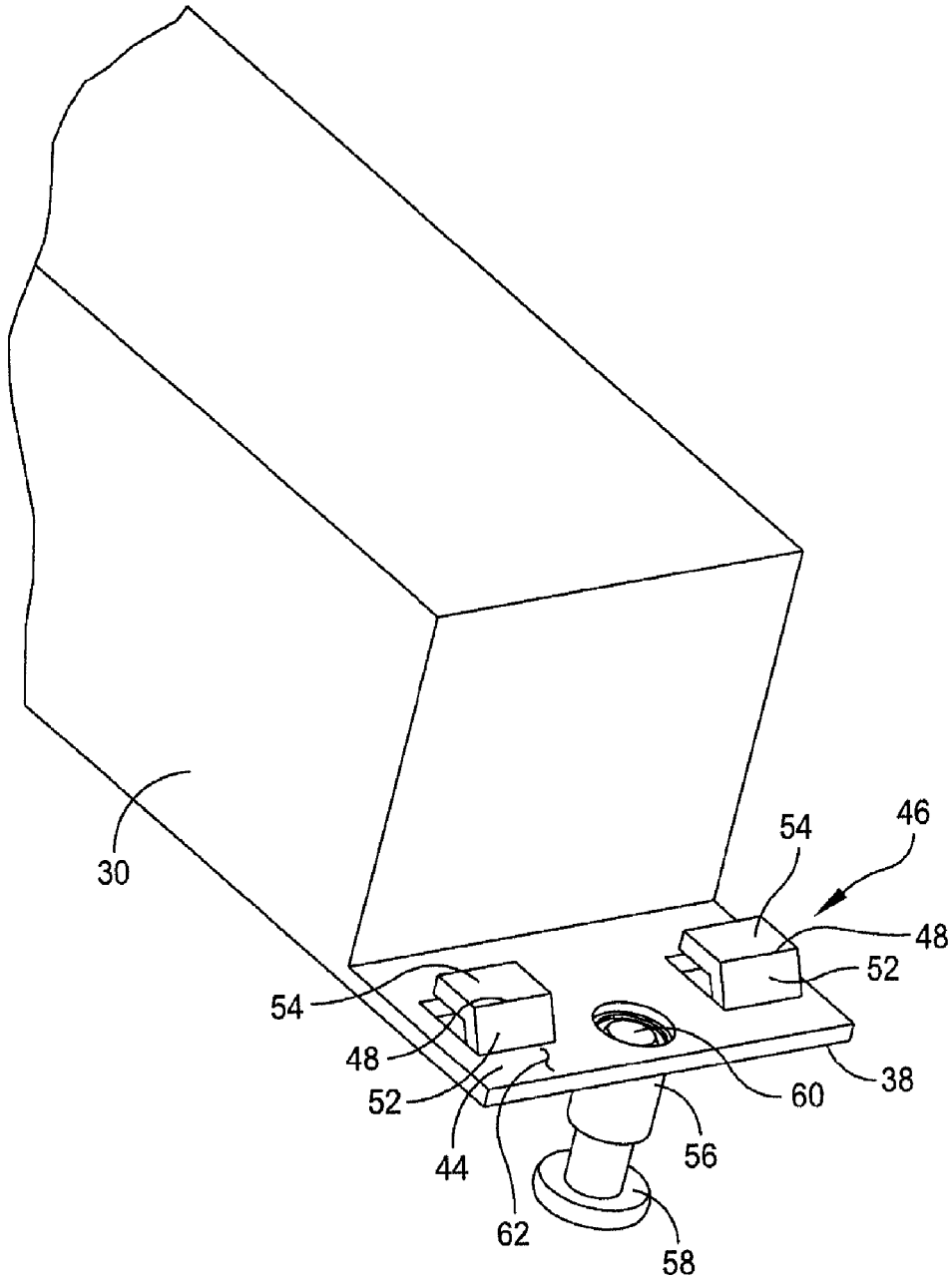
FIG. 4B is a reverse perspective view of the tool-less mounting feature showing the pin portion of the plunger pin assembly in a retracted position.

Referring to FIG. 3, and with further reference to FIGS. 4A and 4B, which illustrates end 38 of the body 30 of the device 28, in one aspect of the disclosure, the attachment configuration 46 provided at the flange portion 44 includes a pair of retention hooks, each indicated at 48. Each retention hook 48 is defined along an inner surface 50 of the flange portion 44 of the body 30 of the device 28. As shown, each retention hook 48 is configured so that it slopes away from the inner surface 50 and includes a first segment 52 that is bent with respect to the inner surface. The first segment 52 transitions to a second segment 54 that is bent with respect to the first segment and extends along a plane that is parallel with a plane of the flange portion 44. The space between the second segment 54 and the inner surface 50 of the flange portion 44 is sufficient to receive an edge of the mounting flange 24 therein. The retention hooks of each attachment configuration 42, 44 are designed to extend in the same direction so as to enable the insertion of the retention hooks within corresponding openings 26 provided in two mounting flanges 24. The retention hooks 48 may be secured in place by moving the body 30 of the device 28 laterally, which is described in greater detail below.

Still referring to FIGS. 3, 4A and 4B, the attachment configuration 46 is provided with two retention hooks 48, which are spaced apart from one another a distance corresponding to the distance of spaced apart openings 26 formed in the mounting flanges 24. Specifically, the distance between the retention hooks 48 may correspond to the distance of two openings 26 formed in the mounting flange 24 with one opening disposed between the two openings. Other spacing may be selected based on design criteria. The retention hooks 48 of each end 36, 38 of the device 28 are configured to extend into the openings 26 provided within the mounting flanges 24. Thus, all four retention hooks 48 are inserted into four corresponding openings 26 formed in the two mounting flanges 24. The arrangement is such that once the retention hooks 48 are inserted into their corresponding openings 26, the body 30 of the device 28 may be shifted or moved laterally with respect to the mounting flanges 24, depending on the direction of the retention hooks, so that the retention hooks engage the mounting flanges.

Figure 5:
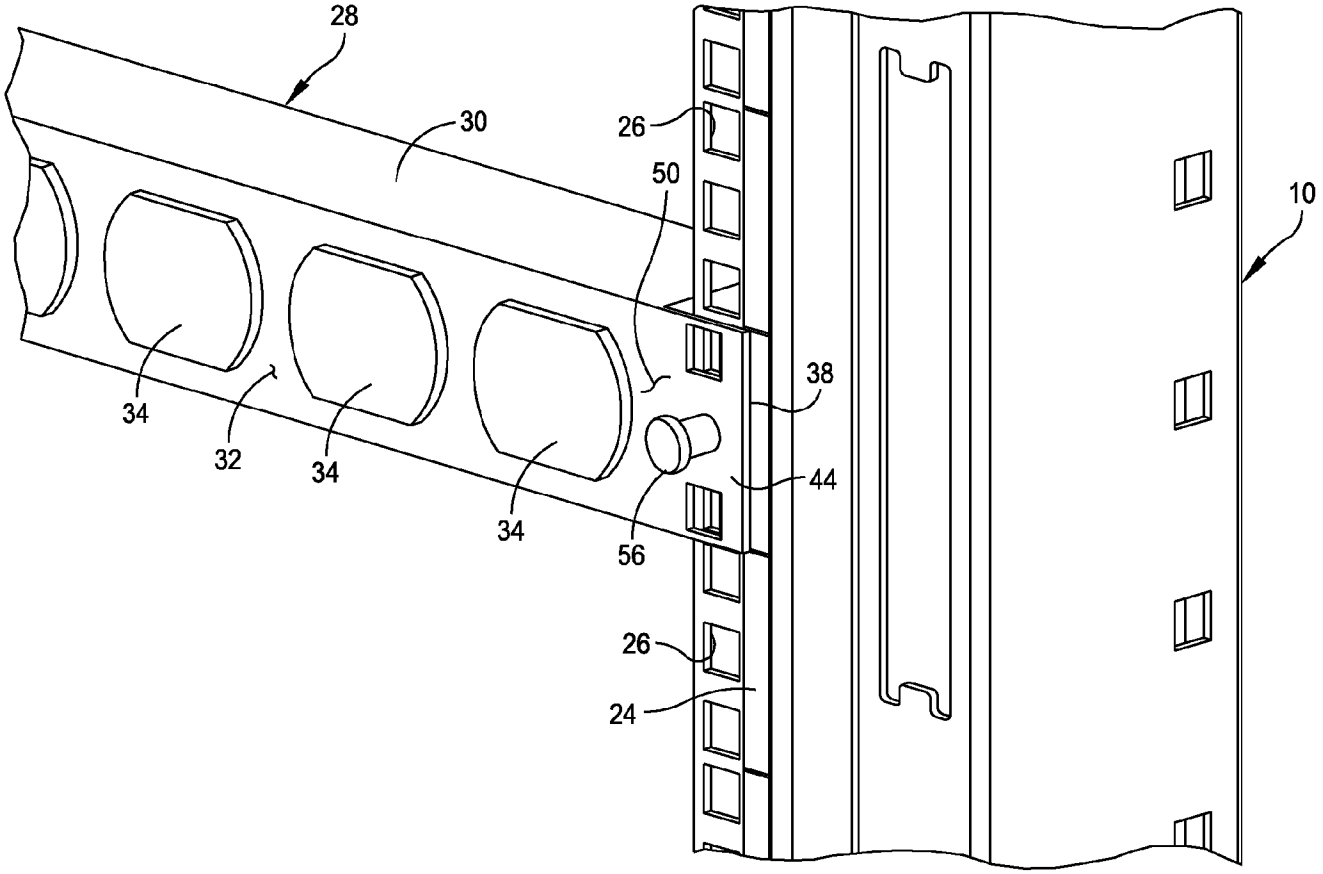
FIG. 5 is a perspective view of the device secured to the equipment rack.
Figure 6:
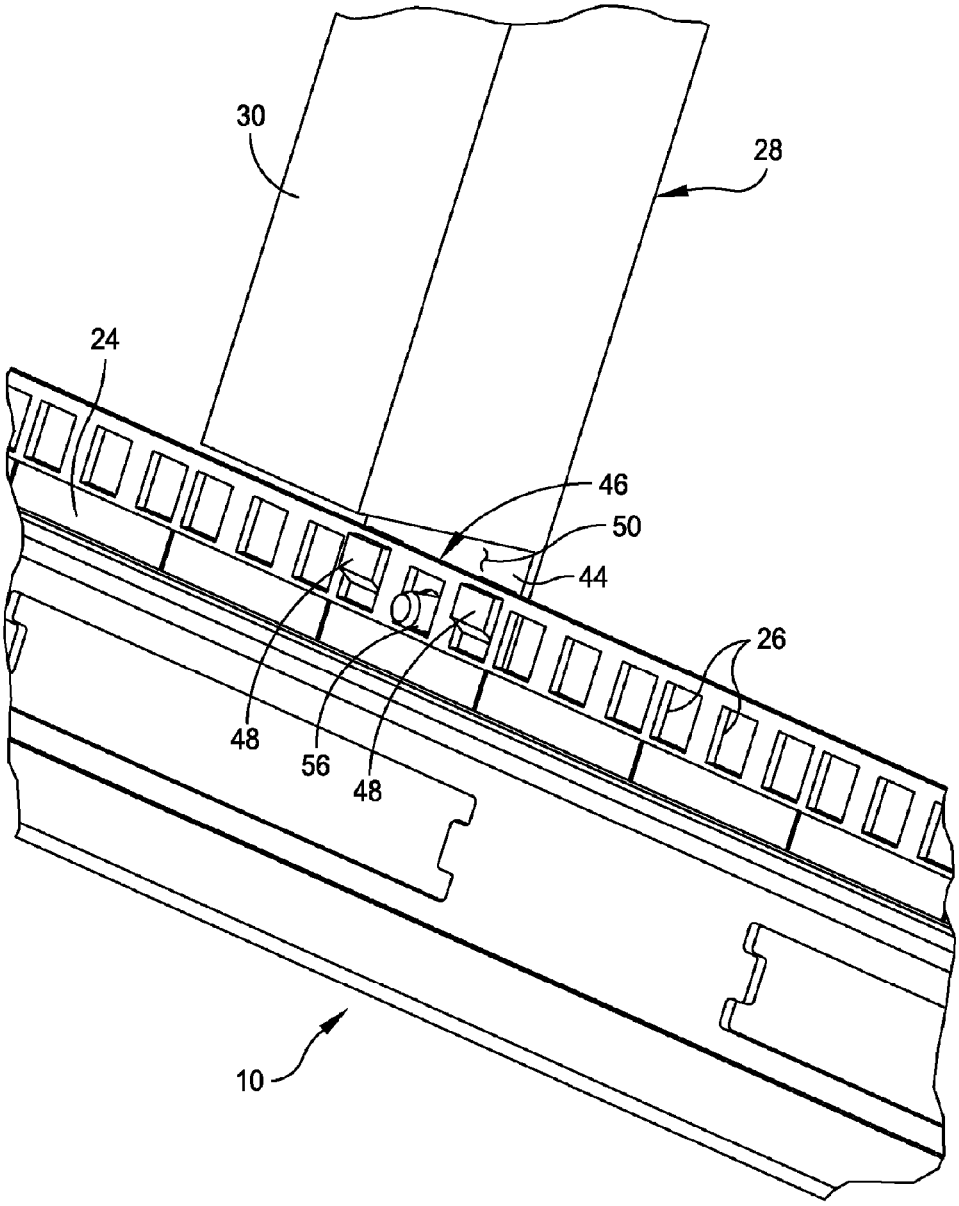
FIG. 6 is a reverse perspective view of the device secured to the equipment rack.

FIGS. 5 and 6 illustrate an arrangement in which the retention hooks 48 are inserted into openings 26 provided in the mounting flange 24 so that the retention hooks extent into and may be moved laterally within the openings. With the embodiment disclosed herein, the device 28 includes four retention hooks 48 that are received within four openings 26 provided in two spaced-apart, mounting flanges 24, although only one mounting flange is illustrated in FIG. 6.

Referring to FIGS. 3-6, one of the two attachment configurations, e.g., attachment configuration 46, includes a plunger pin assembly 56 disposed between the retention hooks 48. In the embodiment illustrated in these drawings, the flange portion 44 provided on the right-hand side of the body 30 of the device 28 includes the plunger pin assembly 56. The plunger pin assembly 56 includes a larger head portion 58 and a pin portion 60. The head portion 58 extends from an outer surface 62 of the flange portion 44 and the pin portion 60 extends from an inner surface 50 of the flange portion. The arrangement is such that the pin portion 60 of the plunger pin assembly 56 may be extended, as shown in FIG. 4A, and retracted, as shown in FIG. 4B. When extended, the pin portion 60 of the plunger pin assembly 56 extends into the opening 26 provided between the two openings 26 receiving the retention hooks 48 to lock the attachment configuration 46 in place with respect to the mounting flange 24. In one embodiment, the pin portion may be spring-loaded so that the pin portion remains in the extended position, and by moving the head portion 58, the pin portion may be moved against the bias of a spring or other mechanism providing the bias.

The pin portion 60 of the plunger pin assembly 56 prevents any lateral movement of the device 28 with respect to the two mounting flanges 24 thereby capturing or otherwise locking the retention hooks 48 in place with respect to the mounting flanges. By moving the head portion 58 in a direction away from the outer surface 62 of the flange portion 44, the pin portion 60 of the plunger pin assembly 56 is retracted from the opening 26 in the mounting flange 24 to enable the lateral movement of the device 28. This lateral movement enables the movement of the retention hooks 48 from their respective openings 26. The attachment configurations 42, 46 are symmetrical and are constructed and arranged to permit removal of the device 28 from the equipment rack 10.

In one embodiment, the device 28 may define a nominal 1-U height to provide flexibility and convenience in configuring or rearranging the equipment rack 10. It should be understood that the attachment configurations 42, 46 disclosed herein may be used on any type of device, having 1-, 2-, 3- or more U height, and fall within the scope of this disclosure.

Referring to FIGS. 5 and 6, the attachment and removal of the device 28 from two mounting flanges 24 will be described. The device 28, such as a power distribution unit, is positioned against the equipment rack 10 at a location in which the installer would like to place the device. The retention hooks 48 of the device 28 are aligned with their respective openings 26 of the mounting flanges 24. The body 30 of the device 28 is moved toward the equipment rack so that the retention hooks 48 extend through their respective openings 26.

The pin portion 60 of the plunger pin assembly 56 engages an outer surface of the mounting flange 24. This position is shown in FIG. 5. Next, the body 30 of the device 28 is moved laterally so that the retention hooks 48 engage the mounting flanges 24 along the edges of their respective openings 26 so as to hold or otherwise secure the device in place. The plunger pin assembly 56 is positioned so that upon moving the device 28 laterally, the pin portion 60 of the plunger pin assembly enters its respective opening to "lock" the device in place. This position is shown in FIG. 6.

To remove the device 28 from the equipment rack 10, the plunger pin assembly 56 is moved so that the pin portion 60 is retracted out of the opening 26 of the mounting flange 24. Once removed, the body of the device may be moved laterally in an opposite direction to the movement used to secure the device. At this point the retention hooks may be removed from their respective openings to remove the device from the equipment rack.

Figure 7:
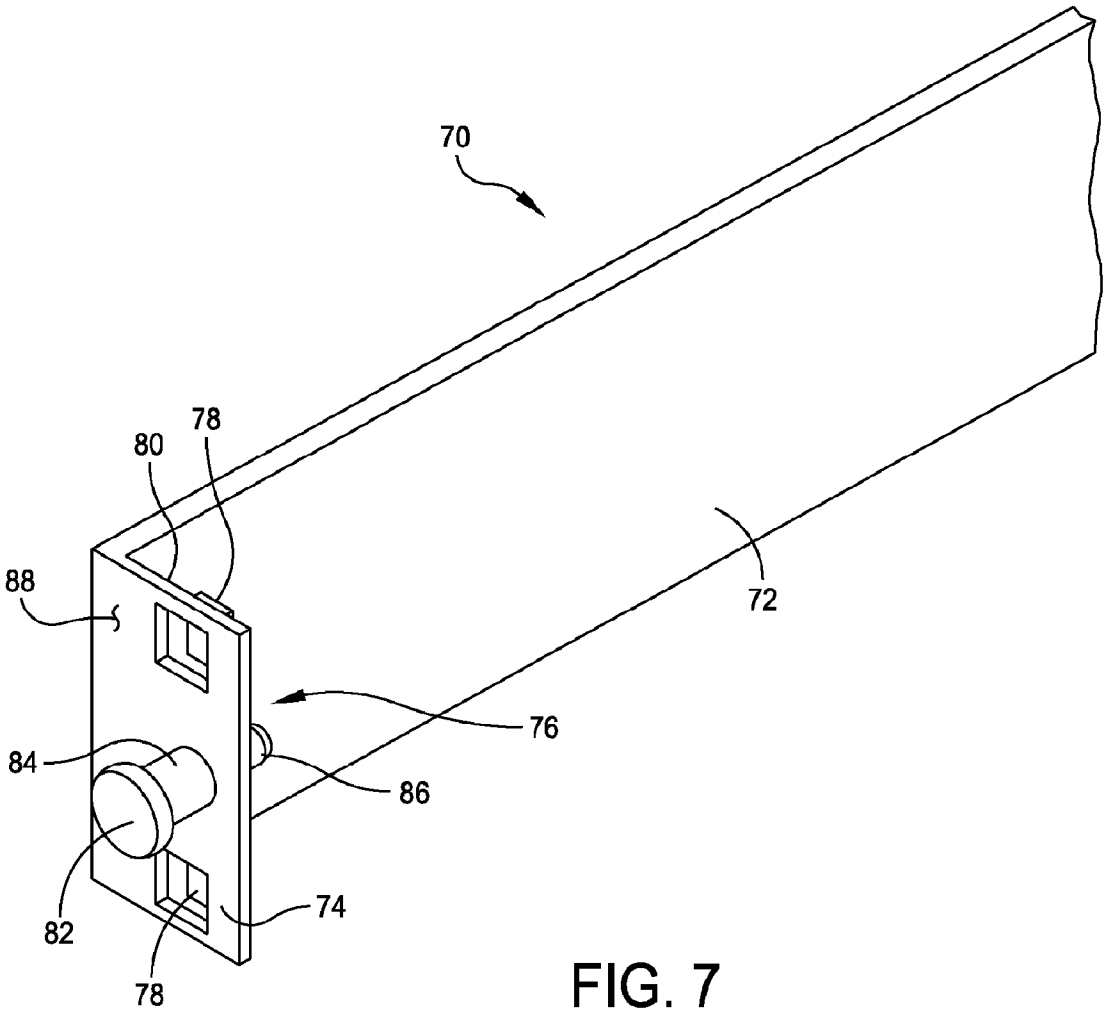
FIG. 7 is a perspective view of a rail configured with a tool-less mounting feature of another embodiment of the disclosure.
Figure 8:
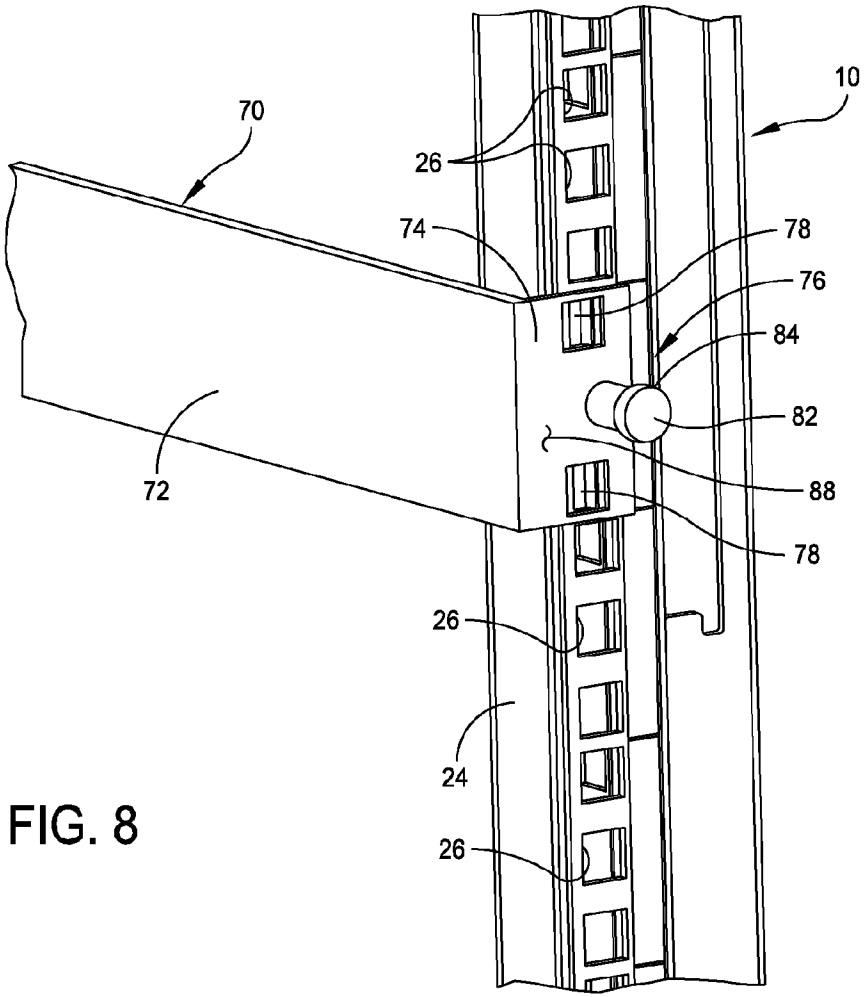
FIG. 8 is a perspective view of the rail shown in FIG. 7 secured to an equipment rack.
Figure 9:
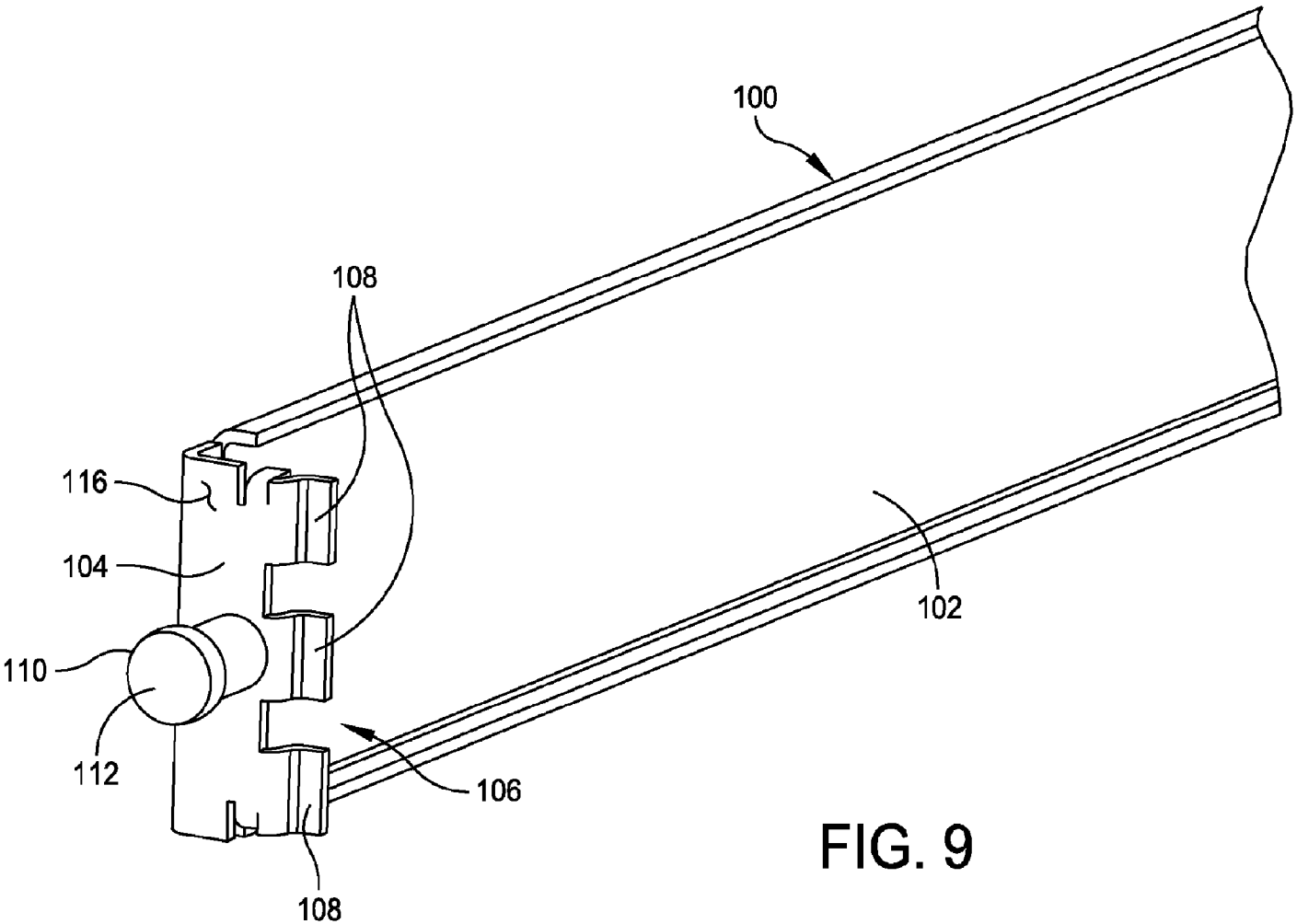
FIG. 9 is a perspective view of a rail configured with a tool-less mounting feature of another embodiment of the disclosure.

FIGS. 7 and 8 illustrate the construction and manner of mounting a rail generally indicated at 70 onto mounting flanges 24 (FIG. 8). In one embodiment, the rail 70 may be configured to mount on the equipment rack 10 along a side of the equipment rack. As shown, the rail 70, which may be configured to support any number of devices associated with an equipment rack, or may be configured to provide lateral stability to an equipment rack, includes an elongated body 72 having a flange 74 disposed at each end of the body. Although FIGS. 7 and 8 show only one end of the body 72 of the rail 70, it should be understood that the opposite end is configured to be a mirror image of the shown end. Each flange 74 has an attachment configuration, generally indicated at 76, which is constructed and arranged to attach or mount the rail 70 between a pair of adjacent mounting flanges 26 of an equipment rack, such as equipment rack 10. As mentioned above, the rail 70 is configured to mount on a side of an equipment rack; however, other embodiments of the rail may be configured to accommodate different applications or configured to mount on the front or back of the equipment rack.

The body 72 of the rail 70 has a length sufficient to span a distance between the pair of mounting flanges 24 defining a side of the equipment rack 10. The length of the body 72 of the rail 70 can be any length that is sufficient to horizontally mount the rail between a pair of mounting flanges 24 of any equipment rack size or design.

Still referring to FIGS. 7 and 8, in one aspect of the disclosure, each attachment configuration 76 provided at the flange 74 includes a pair of retention hooks, each indicated at 78, similar to the retention hooks 48 described with reference to the device 28. Each retention hook 78 is defined along an inner surface 80 of the flange 74 of the body 72 of the rail 70. As shown, each retention hook 78 is configured so that it slopes away from the inner surface 80 and is bent so that it extends horizontally with respect to the flange 74. The attachment configuration 76 is provided with two retention hooks 78, which are spaced apart from one another a distance corresponding to the distance of spaced apart openings 26 formed in the mounting flanges 24. Specifically, the distance between the retention hooks 78 may correspond to the distance of two openings 26 formed in the mounting flange 24 with one opening 26 disposed between the two openings. Other spacing may be selected based on design criteria. The retention hooks 78 of each end of the rail 70 are configured to extend into the openings 26 provided within the mounting flanges 24. Thus, all four retention hooks 78 are inserted into four corresponding openings 26 formed in the two mounting flanges 24. The arrangement is such that once the retention hooks 78 are inserted into their corresponding openings 26, the body 72 of the rail 70 may be shifted, depending on the direction of the retention hooks, so that the retention hooks engage the mounting flanges 24.

FIG. 8 illustrates an arrangement in which the retention hooks 78 are inserted into openings 26 provided in the mounting flange 24 so that the retention hooks extent into and may be moved laterally within the openings. With the embodiment disclosed herein, the rail 70 includes four retention hooks 78 that are received within four openings 26 provided in two spaced-apart, mounting flanges 24, although only one mounting flange is illustrated in FIG. 8.

As with the device 28, one of the attachment configurations 76 of the rail 70 includes a plunger pin assembly 82 disposed between the retention hooks 78. As with plunger pin assembly 56, the plunger pin assembly 82 includes a larger head portion 84 and a pin portion 86. The head portion 84 extends from an outer surface 88 of the flange 74 extending from the inner surface 80 of the flange. The arrangement is such that the pin portion 86 may be extended and retracted. When extended, the pin portion 86 extends into the opening 26 provided between the two openings 26 receiving the retention hooks 78 to lock the attachment configuration 76 of the rail 70 in place with respect to the mounting flange 24. In one embodiment, the pin portion 86 may be spring-loaded so that the pin portion remains in the extended position, and by moving the head portion 84, the pin portion may be moved against the bias of a spring or other mechanism providing the bias.

The pin portion 86 of the plunger pin assembly 82 prevents any lateral movement of the rail 70 with respect to the two mounting flanges 24 thereby capturing or otherwise locking the retention hooks 78 in place with respect to the mounting flanges. By moving the head portion 84 of the plunger pin assembly 82 in a direction away from the outer surface 88 of the flange portion 74, the pin portion 86 is retracted from the opening 26 in the mounting flange 24 to enable the lateral movement of the rail 70. This lateral movement enables the movement of the retention hooks 78 of the body 72 of the rail 70 from their respective openings 26 of the mounting flanges 24.

FIGS. 9-12 illustrate the construction and manner of mounting a rail, generally indicated at 100, of another embodiment, onto mounting flanges 26. In one embodiment, as with rail 70, the rail 100 may be configured to mount on the equipment rack 10 along a side of the equipment rack. As shown, the rail 100, which may be configured to block or otherwise cover a portion of a side of an equipment rack, or to provide air containment within the equipment rack, includes an elongated body 102 having flanges 104 disposed at two, opposite ends of the body. Although FIGS. 9-12 show only one end of the body 102 of the rail 100, it should be understood that the opposite end is configured to be a mirror image of the shown end. Each flange 104 of the body 102 of the rail 100 has an attachment configuration, generally indicated at 106, which is constructed and arranged to attach or mount the rail between a pair of adjacent mounting flanges 24 of an equipment rack, such as equipment rack 10. As mentioned above, the rail 100 is configured to mount on a side of an equipment rack; however, other embodiments of the rail may be configured to mount on the front of the equipment rack, for example.

The body 102 of the rail 100 has a length sufficient to span a distance between the pair of mounting flanges 24 defining a side of the equipment rack 10. The length of the body 102 of the rail 100 can include any length that is sufficient to horizontally mount the rail between a pair of mounting flanges 24 of any equipment rack size or design. It should be understood that the rails including attachment configurations may be employed in situations in which the rails connect between horizontal mounting flanges or rails and still fall within the scope of the present disclosure.

In one aspect of the disclosure, each attachment configuration 106 provided at the flange 104 includes three retention hooks, each indicated at 108. Each retention hook 108 extends from an edge of the flange 104 in the manner best shown in FIG. 9. As shown, each retention hook 108 is configured so that it is bent so as to achieve an L-shape. The retention hooks 108 are spaced apart from one another a distance corresponding to the distance of three spaced apart openings 26 formed in the mounting flanges 24. In the shown embodiment, the retention hooks 108 are spaced apart to correspond to three sequential openings 26 provided in the mounting flange 24. In other embodiments, a different spacing may be provided. The retention hooks 108 of each end of the rail 100 are configured to extend into the openings 26 provided within the mounting flanges 24. Thus, all six retention hooks 108 are inserted into six corresponding openings 26 formed in the two mounting flanges 24. The arrangement is such that once the retention hooks 108 are inserted into their corresponding openings 26, the body 102 of the rail 100 may be shifted, depending on the direction of the retention hooks, so that the retention hooks engage the mounting flanges 24.

Figure 10:
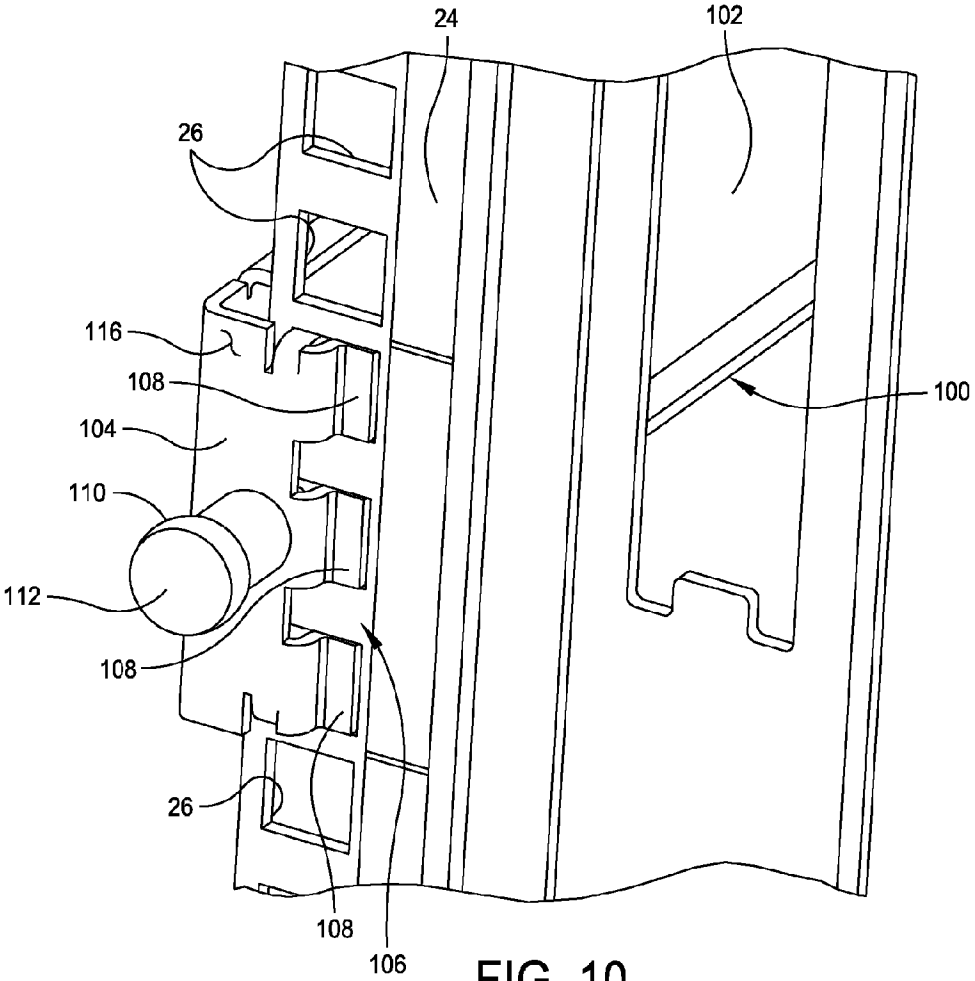
FIG. 10 is a perspective view of the rail shown in FIG. 9 in the process of being secured to an equipment rack.
Figure 11:
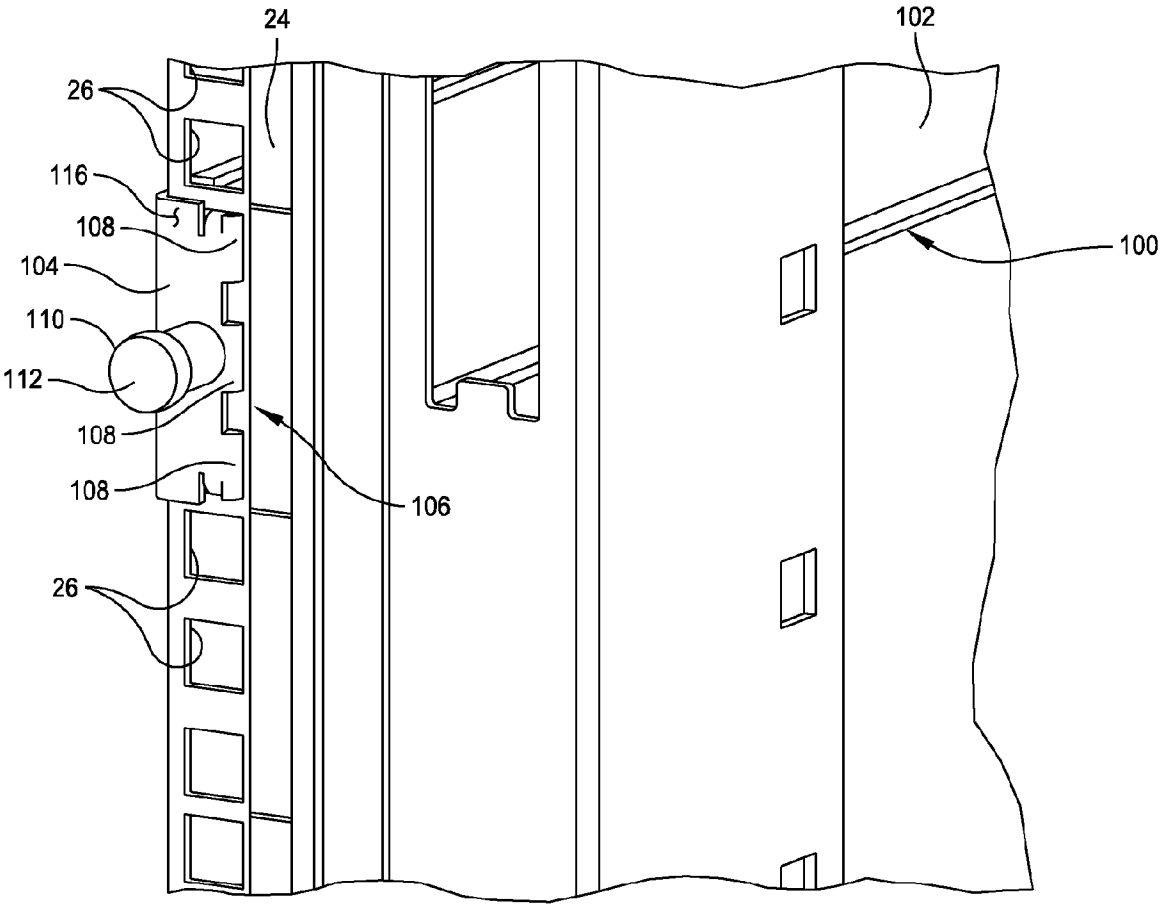
FIG. 11 is a perspective view of the rail shown in FIGS. 9 and 10 secured to the equipment rack.
Figure 12:
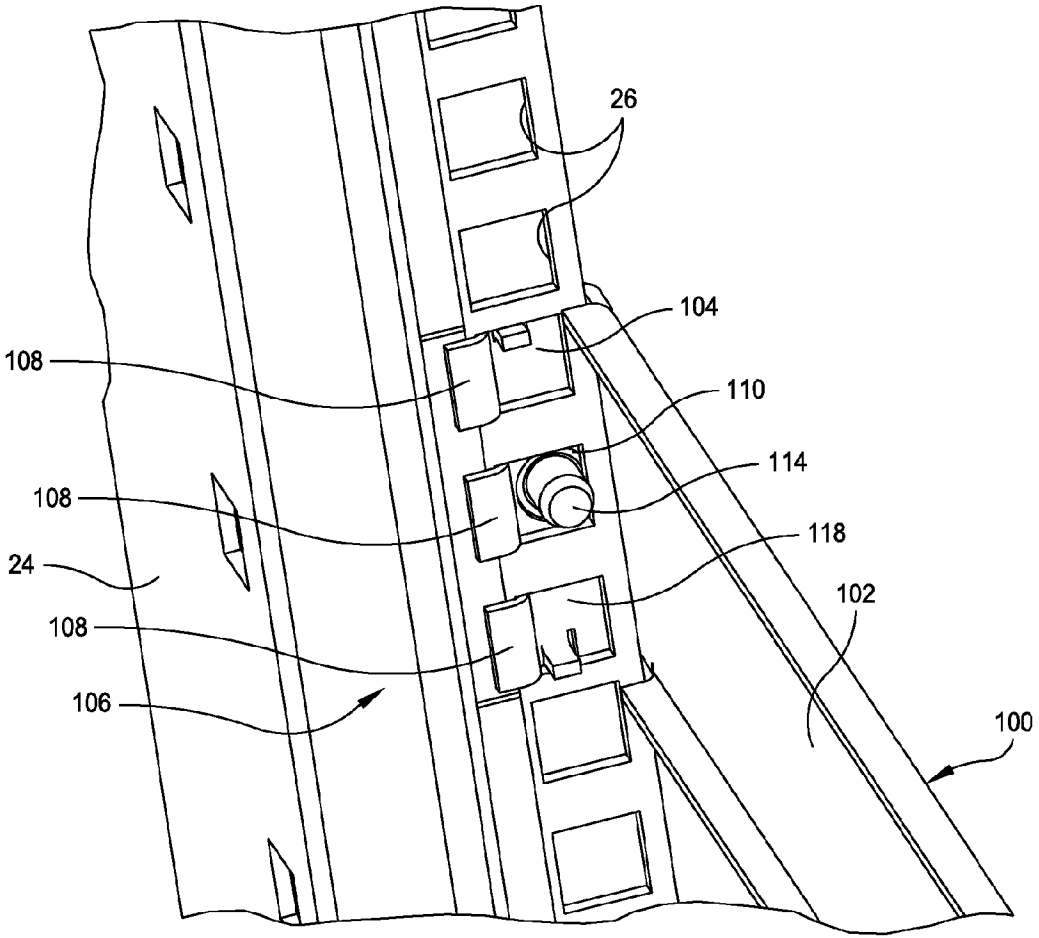
FIG. 12 is a reverse perspective view the rail shown in FIG. 11.

FIGS. 10-12 illustrate an arrangement in which the retention hooks 108 are inserted into openings 26 provided in the mounting flange 24 so that the retention hooks extent into and may be moved laterally within the openings. With the embodiment disclosed herein, the rail 100 includes six retention hooks 108 that are received within six openings 26 provided in two spaced-apart, mounting flanges 24, although only one mounting flange is illustrated in FIGS. 10-12.

As with the device 28 and the rail 70, one of the two attachment configurations 106 of the rail 100 includes a plunger pin assembly 110 disposed adjacent to the middle retention hook 108. The plunger pin assembly 110 includes a larger head portion 112 and a pin portion 114 (FIG. 12). The head portion 112 of the plunger pin assembly 110 extends from an outer surface of the flange 104 and the pin portion 114 extends from an inner surface 118 (FIG. 12) of the flange. The arrangement is such that the pin portion 114 of the plunger pin assembly 110 may be extended and retracted. When extended, the pin portion 114 of the plunger pin assembly 110 extends into the opening 26 receiving the middle retention hook 108 to lock the attachment configuration 106 of the rail 100 in place with respect to the mounting flange 24. In other words, the pin portion 114 of the plunger pin assembly 110 prevents any substantial lateral movement of the rail 100 sufficient to remove the retention hooks 108 from their respective openings 26. In one embodiment, the pin portion 114 of the plunger pin assembly 110 may be spring-loaded so that the pin portion remains in the extended position, and by moving the head portion 112, the pin portion may be moved against the bias of a spring or other mechanism providing the bias.

As mentioned, the pin portion 114 of the plunger pin assembly 110 prevents any substantial lateral movement of the rail 100 with respect to the two mounting flanges 24 thereby capturing or otherwise locking the retention hooks 108 in place with respect to the mounting flanges. By moving the head portion 112 of the plunger pin assembly 110 in a direction away from the outer surface 116 of the flange 104, the pin portion 114 is retracted from the opening 26 in the mounting flange 24 to enable the lateral movement of the rail 100. This lateral movement enables the movement of the retention hooks 108 from their respective openings 26.

Figure 13:
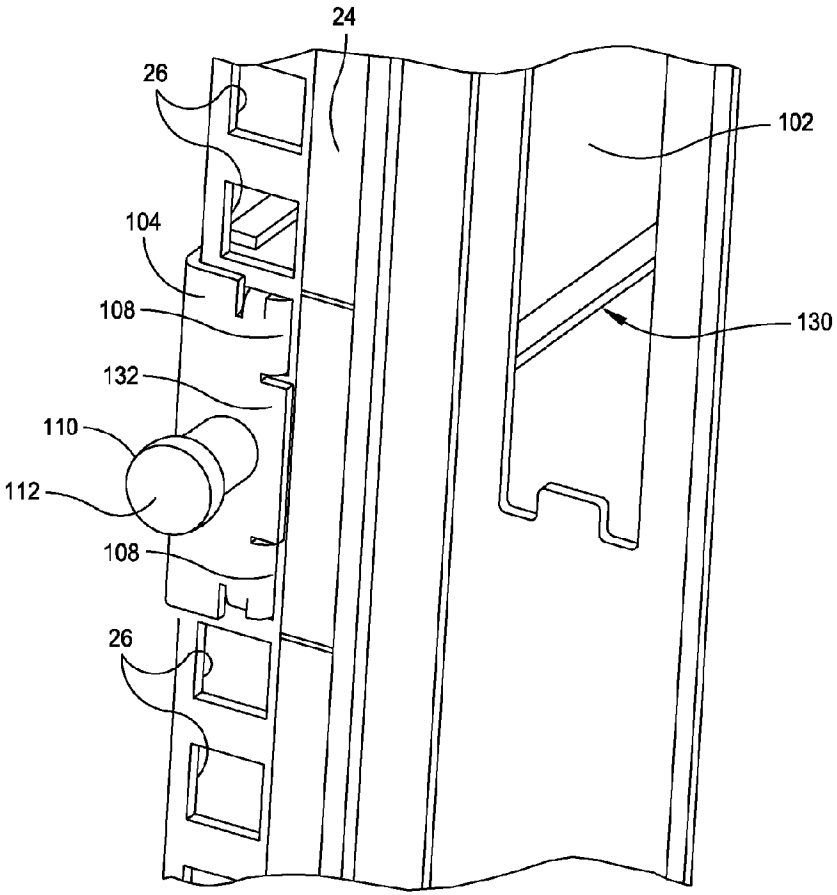
FIG. 13 is a perspective view of another rail configured with a tool-less mounting feature of another embodiment of the disclosure.

FIG. 13 illustrates a rail generally indicated at 130 that is similar to the rail shown in FIGS. 10-12. As shown, rail 130 includes a tab portion 132 having retention hooks 108. The plunger pin assembly 110 is disposed between the retention hooks 108 to secure the rail 130 in place.

It should be understood that the types of devices incorporating the attachment configurations of embodiments of the disclosure may include any number of assemblies and mechanisms used with equipment racks. Other examples of such devices may include rails, patch panels, blanking panels, brush strip panels, fan panels, sensor panels, and the like. The rails may be used to support shelves, servers, routers, and the like.

In addition, although embodiments of the devices, rails and panels have two or three retention hooks provided with each attachment configuration, any number of retention hooks may be included and still fall within the scope of the present disclosure. Moreover, although the plunger pin assembly is shown typically on the right-hand side attachment configuration, it may be included on the other side of the device, rail or panel, or on both sides of the device, rail or panel when employing only one retention hook. Also, the plunger pin may be disposed anywhere along a length of the flange and does not have to be centrally located on the flange. In addition, the plunger pin may be configured to be received within flanges having circular openings rather than square openings, which are illustrated throughout the drawing figures. Further, the plunger pin may be replaced by another type of releasable fastener suited to retain the devices, rails and/or panels in place.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. A device configured to be secured within a 19-inch or a 23-inch equipment rack having two spaced-apart mounting flanges, each flange having a plurality of openings formed therein spaced-apart from one another a predetermined distance of [1.75] *0.625* inches, the device comprising:

an elongated body having a front surface and two, opposite ends, each end of the elongated body having a flange portion that extends along a plane parallel to a plane of the front surface; and two attachment configurations, one for each flange portion of the elongated body, each attachment configuration including two retention hooks to be inserted within the openings of the mounting flanges, each retention hook being defined along an inner surface of the flange portion of the body and configured so that the retention hook slopes away from the inner surface of the flange portion, each retention hook including a first segment that is bent with respect to the inner surface and a second segment that is bent with respect to the first segment and extends along a plane that is parallel with a plane of the flange portion, the retention hooks of each attachment configuration extending in the same direction along a length of the body so as to enable the insertion of the retention hooks within corresponding openings provided in two mounting flanges, at least one attachment configuration including a plunger pin disposed between the retention hooks configured to retain the device to the mounting rails, each retention hook being disposed [1.75] *0.625* inches from the plunger pin, the attachment configuration being constructed and arranged to facilitate toolless installation and removal of the device with the mounting rails.

2. The device of claim 1, wherein the plunger pin includes a head portion extending from an outer surface of the flange portion and a pin portion extending from an inner surface of the flange portion.

3. The device of claim 1, wherein the hooks are secured in place by moving the body of the device laterally.

4. The device of claim 1, wherein the device is a power distribution unit.

5. The device of claim 1, wherein the device is one of a rail and a panel.

6. A device configured to be secured within a 19-inch or a 23-inch equipment rack having two spaced-apart mounting flanges, each flange having a plurality of openings formed therein spaced-apart from one another a predetermined distance of [1.75] *0.625* inches, the device comprising:

an elongated body having a front surface and two, opposite ends, each end of the elongated body having a flange portion that extends along a plane parallel to a plane of the front surface; and two attachment configurations, one for each flange portion of the elongated body, each attachment configuration including two retention hooks to be inserted within the openings of the mounting flanges, each retention hook being defined along an inner surface of the flange portion of the body and configured so that the retention hook slopes away from the inner surface of the flange portion, each retention hook including a first segment that is bent with respect to the inner surface and a second segment that is bent with respect to the first segment and extends along a plane that is parallel with a plane of the flange portion, the retention hooks of each attachment configuration extending in the same direction along a length of the body so as to enable the insertion of the retention hooks within corresponding openings provided in two mounting flanges, at least one attachment configuration of the two attachment configurations including means, disposed between the retention hooks, for releasably securing the device to the mounting rails, each retention hook being disposed [1.75] *0.625* inches from the means for releasably securing the device to the mounting rails, the attachment configuration being constructed and arranged to facilitate tool-less installation and removal of the device with the mounting rails.

7. The device of claim 6, wherein the means for releasably securing the device to the mounting rails comprises a plunger pin including a head portion extending from an outer surface of the flange portion and a pin portion extending from an inner surface of the flange portion.

8. The device of claim 6, wherein the hooks are secured in place by moving the body of the device laterally.

9. The device of claim 6, wherein the device is a power distribution unit.

10. The device of claim 6, wherein the device is one of a rail and a panel.

11. A method of installing a device on a 19-inch or a 23-inch equipment rack having two spaced-apart mounting flanges, each flange having a plurality of openings formed therein spaced-apart from one another a predetermined distance of [1.75] *0.625* inches, the method comprising:

providing a device comprising an elongated body having a front surface and two, opposite ends, each end of the elongated body having a flange portion that extends along a plane parallel to a plane of the front surface, and two attachment configurations, one for each flange portion of the elongated body, each attachment configuration including two retention hooks to be inserted within the openings of the mounting flanges, each retention hook being defined along an inner surface of the flange portion of the body and configured so that the retention hook slopes away from the inner surface of the flange portion, each retention hook including a first segment that is bent with respect to the inner surface and a second segment that is bent with respect to the first segment and extends along a plane that is parallel with a plane of the flange portion, the retention hooks of each attachment configuration extending in the same direction along a length of the body so as to enable the insertion of the retention hooks within corresponding openings provided in two mounting flanges, at least one attachment configuration including a plunger pin disposed between the retention hooks configured to retain the device to the mounting rails, each retention hook being disposed [1.75] *0.625* inches from the plunger pin, the attachment configuration being constructed and arranged to facilitate tool-less installation and removal of the device with the mounting rails;

inserting the retention elements of the device into the respective openings of the mounting flanges;

moving the device in a lateral direction suitable for engaging the retention elements of the device with the mounting flanges; and inserting the plunger pin into an opening of the mounting flange to secure the device in place.

12. The method of claim 11, further comprising, prior to inserting the retention elements of the device into the respective openings, aligning the retention elements of the device with respective openings of the mounting flanges.

* * * * *